United States Patent [19]

Erlach

[11] Patent Number: 5,109,147
[45] Date of Patent: Apr. 28, 1992

[54] SOLDERING TIP FOR MAGNETIC WIRE HOOKUP

[75] Inventor: David M. Erlach, Santa Clara, Calif.

[73] Assignee: Applied Magnetics Corporation, Goleta, Calif.

[21] Appl. No.: 521,239

[22] Filed: May 9, 1990

[51] Int. Cl.$^5$ .............................................. B23K 3/03
[52] U.S. Cl. ............................. 219/85.16; 219/85.18; 219/233; 228/54
[58] Field of Search .................................. 228/51–54, 228/179, 180.2, 44.7, 55, 19–21, 4.5; 219/85.16, 85.22, 85.18, 228–233, 56.1, 56.21, 56.22, 91.21, 137.41, 85.15

[56] References Cited

U.S. PATENT DOCUMENTS

| 3,116,655 | 1/1964 | Esopi ..................................... 228/54 |
| 3,347,442 | 10/1967 | Reber . |
| 3,400,448 | 9/1968 | Helda et al. . |
| 3,444,347 | 5/1969 | Mulcahy ........................ 219/85.15 |
| 3,580,462 | 5/1971 | Vanyi ................................... 228/51 |
| 3,627,192 | 12/1971 | Killingsworth ..................... 228/54 |
| 3,657,508 | 4/1972 | Studnick . |
| 3,963,897 | 6/1976 | Wakita et al. ..................... 219/230 |
| 4,030,657 | 6/1977 | Scheffer . |
| 4,358,662 | 11/1982 | Cranor et al. . |
| 4,415,115 | 11/1983 | James . |
| 4,484,054 | 11/1984 | Morino . |
| 4,580,027 | 4/1986 | Thorwarth . |
| 4,597,520 | 7/1986 | Biggs . |
| 4,877,936 | 10/1989 | Kobayashi ........................ 219/85.18 |
| 4,948,946 | 8/1990 | Fukunaga ............................. 228/20 |

FOREIGN PATENT DOCUMENTS

| 21607064 | 6/1973 | France . |
| 88345 | 7/1980 | Japan . |
| 124430 | 5/1988 | Japan . |

OTHER PUBLICATIONS

Darrow et al., "Substrate Pinning Process Using a Pressed Tapered Pin," *IBM Technical Disclosure Bulletin*, vol. 21, No. 12, May 1979.

"C4 Chip Attachment by Localized Heating," *IBM Technical Disclosure Bulletin*, vol. 30, No. 12, May 1979.

*Primary Examiner*—Geoffrey S. Evans
*Attorney, Agent, or Firm*—Knobbe, Martens, Olson & Bear

[57] ABSTRACT

A small solder tip, which advantageously allows for the rapid production of reliable solder joints without the addition of extra solder, flux or striping the insulation on the wire. The solder tip is preferably formed of tungsten carbide and is used in conjunction with a reflow power supply. In a specific application, the solder tip is utilized for hook-up of magnetic head wires to solder pads. The solder tip comprises a center shaft which allows expanding gases to escape in order to prevent solder from being squeezed out by the pressure build up. The base extremity of the solder tip which contacts the wire is structured with a stepped surface having an opening for accepting the wire therethrough and a projecting leg for contacting the wire and immersing the wire in molten solder. The solder tip additionally comprises a room which provides space for excess solder, enabling the solder tip to accommodate larger variation in solder volume on the pads.

8 Claims, 4 Drawing Sheets

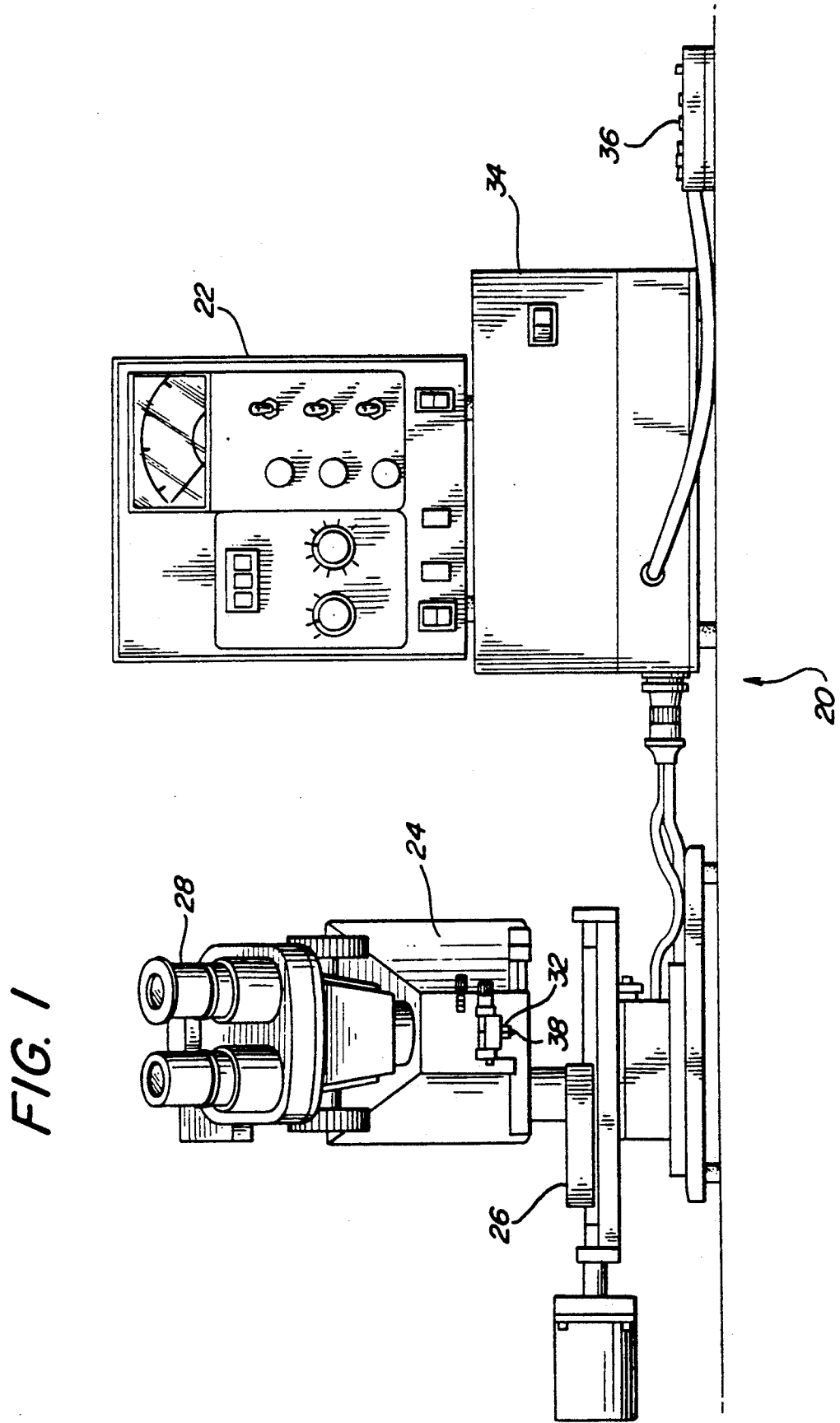

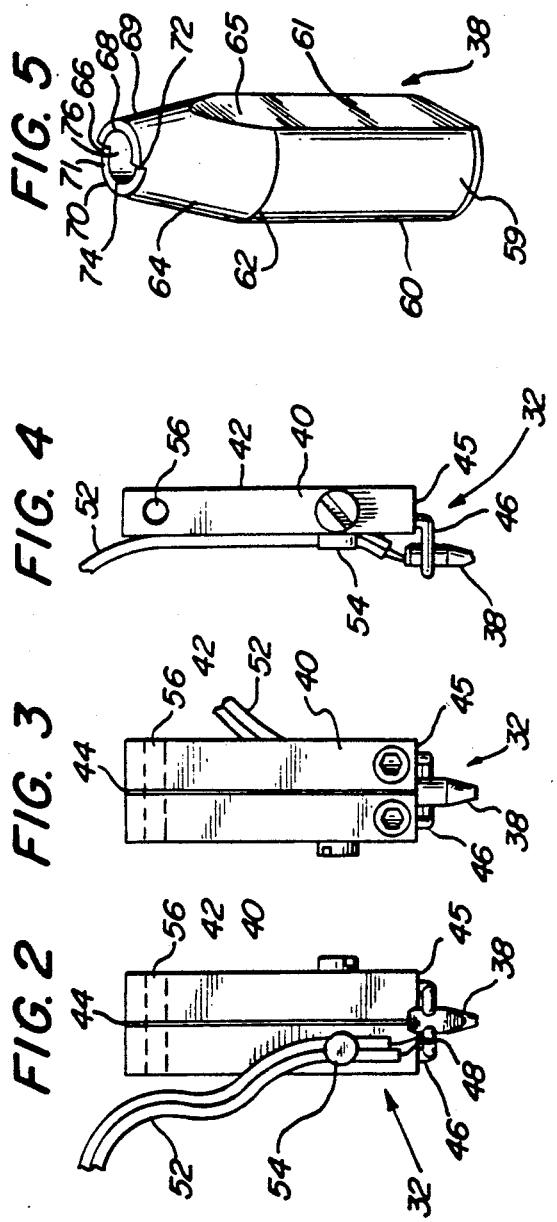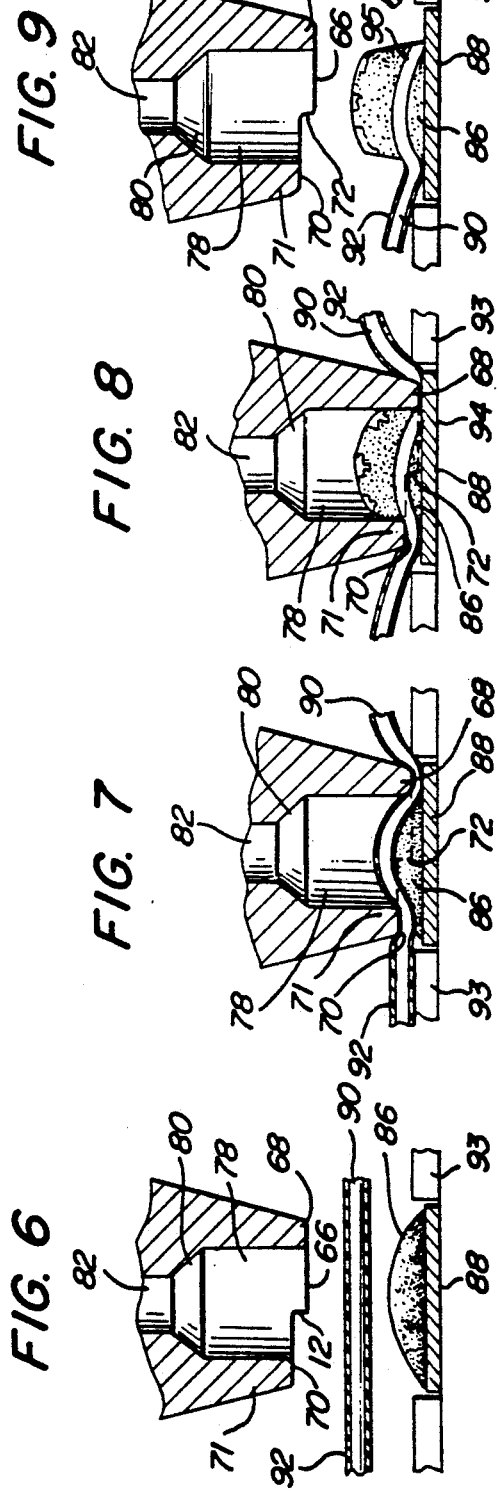

SOLDERING TIP FOR MAGNETIC WIRE HOOKUP

BACKGROUND OF THE INVENTION

This invention relates generally to soldering devices. More particularly, the present invention relates to an improved solder tip and method of soldering which results in consistently reliable solder joints. The apparatus of the present invention is particularly advantageous for use in intricate soldering operations for example such as hooking up magnetic head wires to solder pads in magnetic disk drives.

Soldering techniques have long been used to connect wires or conductive leads to terminal pads. There are a variety of soldering devices and techniques which are used to form solder connections. In the simplest form, solder connections are made by using a manual soldering iron to heat solder in conjunction with flux. In this instance, solder is fed to the joint by hand. More sophisticated systems are used, at greater expense, to provide solder connections which are more reliable than those yielded by conventional hand soldering techniques. A common technique referred to as reflow soldering involves the use of preformed deposits of solder placed close to the joint before heating. Heating the solder causes it to reflow, allowing immersion of a wire in the molten solder.

With any approach, the increasing trend toward micro-miniaturization and high density packaging in the electronics and other manufacturing industries has made the task of soldering more difficult. Often, conductive leads are finer than a human hair, making it difficult to form a reliable solder joint.

Moreover, connections are ordinarily placed in such close proximity that bridging or short circuit problems tend to occur more easily. Further, because of the site of the solder joint and the resulting difficulty in making the solder connection, the joint is often very weak or has a troublesome tail end extending therefrom, which increases the probability of a short circuit. Inadequate clearance for the operation of any severing mechanism makes it difficult to remove such tail ends. This problem is particularly significant where many leads are located within a small space. Tail ends commonly are manually removed subsequent to the soldering operation by cutting the tail end with some sort of severing mechanism.

A further drawback when the solder and flux are applied manually is that the heating of flux generally results in a generation of fumes and/or smoke which are usually objectionable to the solderer. Even with the use of conventional exhaust hoods, the flux fumes rise from the soldering site and pass by the operator before being withdrawn by an exhaust system. Fumes and smoke obstruct the soldering operator's vision and make it more difficult for him or her to observe the fine conductive leads and the soldering operation. Moreover, expanding gases generated during the soldering operation result in a pressure build up which causes the solder to squeeze out around the solder pad. This is an area of grave concern especially if the solder which has squeezed out comes in contact with an adjacent solder pad. Normally, a certain amount of clearance between adjacent pads is always maintained. Thus, loose solder is a significant problem and has to be removed.

The segment of wire to be soldered is commonly prestripped either manually or by any other technique prior to initiating a soldering operation. Obviating the insulation stripping operation, which is normally required, is desirable in any application, in particular, where a large number of leads are soldered. In an attempt to eliminate the insulation stripping operation, the wire is subjected to extremely high temperatures sufficient to automatically break the insulation from the wire. However, subjecting the wire to extremely high temperatures is not always desirable because high temperatures are more likely to damage the areas in the immediate vicinity.

In particular, in the field of magnetic disk drives, when hooking up magnetic head wires to solder pads, the conductivity and the resistance provided by the wire are of paramount importance. In order to make a reliable connection, it is essential for the magnetic wire to be properly covered with solder. Additionally, in a reflow soldering system, the magnetic wire sometimes has a tendency to float to the top of the solder deposit which results in a weak connection. Conventionally used soldering tips also have a tendency to ruin the (KAPTON) layer on the Printed Circuit Board (PCB) and sometimes the adhesive squeeze-out around the solder pad.

The foregoing problems have created an ongoing quest and an urgent need for an improved soldering technique which is reliable and efficient yet economical.

SUMMARY OF THE INVENTION

The present invention provides an improved solder tip which in a preferred form is formed from tungsten carbide and is used in conjunction with a reflow soldering system. In one application, the solder tip is utilized in the field of magnetic disk drives for hooking up of magnetic head wires to solder pads. The solder tip has a unique igloo-like configuration which advantageously facilitates rapid production of reliable solder joints without addition of extra solder, flux or stripping of the insulation on the wire prior to the soldering operation.

In accordance with a preferred aspect of the invention, the solder tip comprises a shaft or vent, preferably in the center which allows expanding gases generated during a soldering operation to escape in order to prevent solder from being squeezed out which results from a build up of pressure.

In accordance with another preferred aspect of the invention, the base extremity of the solder tip which contacts the wire is uniquely structured with an igloo shaped end. The end surface has a stepped shape which forms an opening for accepting the wire, and a projecting leg which contacts the other end of the wire to immerse the wire in molten solder. Once the solder connection has been formed, the trailing end of the wire is gently fatigued and easily broken off. Alternatively, the projecting leg may be provided with a sharp surface to sever the trailing edge of the wire. In an alternative form, the end surface has a stepped surface which has two projecting legs forming two openings therebetween, one for accepting the wire and one through which the wire exits. In addition, the solder tip advantageously comes to rest on the trailing wire and prevents excessive contact with or denting of the copper conductor and (KAPTON).

In accordance with yet another preferred aspect of the invention, the solder tip comprises a counter bore room which provides space for excess solder, enabling the solder tip to accommodate large variations in solder volume on the pads. In this way, excess solder is not squeezed out near adjacent electrical connections.

These, as well as other features of the invention will become apparent from the detailed description of the preferred embodiment which follows, considered together with the appended drawings.

BRIEF DESCRIPTION OF THE DRAWINGS

A preferred embodiment of the present invention, as well as an alternate embodiment is illustrated in and by the following drawings in which like reference numerals indicate like parts and in which:

FIG. 1 is a front elevational schematic view of an exemplary semi-automated soldering system comprising a solder tip made in accordance with a preferred embodiment of the present invention.

FIG. 2 is a front elevational view of the solder tip of the present invention mounted to a solder tip assembly of the semi-automated soldering system.

FIG. 3 is a rear elevational view of the solder tip assembly comprising the solder tip of the present invention.

FIG. 4 is a side elevational view of the solder tip assembly comprising the solder tip of the present invention.

FIG. 5 is a perspective view of the solder tip of the present invention illustrating the stepped configuration of the base extremity.

FIG. 6 is a cross sectional view taken along line 6—6 of the solder tip of FIG. 4. FIG. 6 also illustrates the solder tip of the present invention positioned directly over the wire and solder deposit.

FIG. 7 is a cross sectional view illustrating the manner in which the solder tip of the present invention contacts the wire with its base extremity.

FIG. 8 is a cross sectional view illustrating the manner in which the solder tip of the present invention during a soldering operation 1) burns the insulation from the wire; 2) allows expanding gases to escape through the vent to prevent solder from squeezing out and 3) accommodates excess solder within the counter bore "room."

FIG. 9 is a cross sectional view illustrating the manner in which the solder tip of the present invention severs the trailing edge of the wire with a sharp surface provided on the projecting leg.

DETAILED DESCRIPTION OF A PREFERRED EMBODIMENT

Figure 10:
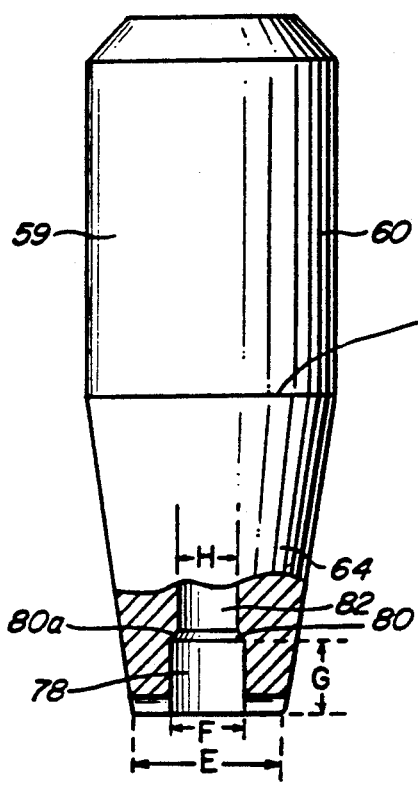
FIG. 10 is a rear elevational view partially in section illustrating the igloo-like configuration of the vent and counter bore room.

Referring now to the drawings in detail, wherein like reference numerals designate like elements throughout the several views thereof, there is shown in FIG. 1, a semi-automated soldering system or electronic welding equipment 20 which is exemplary of soldering devices. The soldering system or electronic welding equipment 20 shown may be used for any number of intricate soldering operations, including for example, hooking up magnetic head wires to solder pads. The soldering system 20 comprises a solder tip assembly 32 which has a solder tip 38 of the present invention mounted thereto. The solder tip 38 in accordance with the present invention may be suitably adapted for use with or in any soldering device to provide advantageous results. The soldering system or electronic welding equipment 20, shown in FIG. 1 and described herein, by way of example, is designed and built by Hughes Aircraft Company. This particular system includes a Hughes Micro Weld Head which is commercially available as MODEL VTA-96, MODEL VTA-96-MV, MODEL VTA-96-TC, MODEL VTA-96-MV-TC; and a Reflow Solder Power Supply commercially available as MODELS HTT-600, HTT-650, HTT-700 AND HTT-750. Any such system advantageously results in consistently reliable solder connections in less time than with other common techniques ordinarily employed for hooking up magnetic wires.

Such a soldering system 20 typically comprises an advanced AC reflow power supply 22 which provides the power required to form a solder joint and a solder head 24 with a programmable x-y translation stage 26. An operator may control both the solder head 24 and the x-y translation stage 26 in order to properly position the wires. The solder head 24 is used to position a solder tip assembly 32 and provide a controlled load force on the solder joint. A suitable load force, preferably 200 grams is advantageously used to ensure sufficient pressure to provide adequate heat transfer to the solder joint. An excessive load force is avoided because it can damage the PCB (Printed Circuit Board) or shear the wire prematurely.

During a soldering operation, the solder head 24 is actuated downward by a foot pedal (not shown) until the solder tip 38 comes in contact with a wire 90 placed over a solder pad 88. Typically, the solder pad 88 is precoated with solder so that when heat and pressure are simultaneously applied, the solder melts and later freezes to form a solder joint, as best shown in FIGS. 6, 7, 8 and 9 and described in greater detail at a later point in the application. Actuating the solder head 24 in a downward direction triggers the power supply 22 and the x-y translation stage 26. The x-y translation stage 26 has an optional "SHAKE" feature which causes the x-y translation stage 26 to vibrate at a predetermined frequency, time and a set amplitude. This "SHAKE" feature is triggered by actuating a microswitch (not shown) in the solder head 24 which is connected to the foot pedal. This feature may advantageously be used by an operator to break through stubborn wire insulation and/or troublesome solder pads. The amount of power required for this operation is determined by a system controller 34.

The x-y translation stage 26 is preferably a conventional 4"×5" D.C. stepper driven table with a full step resolution of 0.001 inches. The system controller 34 controls the motion of the x-y translation stage 26. The system controller 34 is preferably a re-programmable computer. A hand-held control 36 and the foot pedal drive the x-y translation stage 26 by virtue of a special internal computer program. The system 20 also includes a scope 28 through which an operator can observe the soldering operation.

To use such a system, the operator places the part to be soldered on the x-y translation stage 26. The operator then depresses the foot pedal to bring the part on the x-y translation stage 26 into position Typically, an operator looks through a cross-hair eyepiece on the scope 28 and uses the handheld control 36 to manipulate and adjust the x-y translation stage 26 so that the cross-hairs are directly centered on the solder pad 88. The cross-hairs indicate the center position of the solder tip assembly 32.

When the cross-hairs are positioned directly over the desired solder pad, the operator positions the appropriate magnetic head wire 90 on the center of the solder pad 88 (as best shown in FIGS. 6, 7, 8 and 9). The handheld control 36 can be used for any fine adjustment that may be necessary. The operator depresses the foot pedal to bring the solder tip 38 down toward the solder pad 88 and wire 90. As the operator continues to depress the foot pedal, the power supply 22 will turn on causing the solder tip assembly 32 to heat and reflow the solder deposit on the solder pad 88. If additional effort is required to break through the insulation or oxidation, the operator can depress the foot pedal completely, activating the optional "SHAKE" mode in the x-y translation stage 26.

Next, the operator relaxes the foot pedal to expose the newly formed joint. If the joint is acceptable, the x-y translation stage 26 is moved so that the solder tip 38 is positioned over the next solder pad. The process is repeated until all the solder joints are made. Then, the next part that needs to be soldered is placed on the x-y translation stage.

The foregoing soldering process involves several critical parameters which must be observed in order to produce high quality solder joints. The solder tip 38, when inactive, maintains a steady state temperature or idle temperature which is preferably above room temperature. In an exemplary embodiment, the ideal temperature is about 100° C. Shortly after the solder cycle is initiated, the solder tip 38 reaches a bond temperature which is the temperature at which the solder tip 30 operates. The bond temperature should be selected to be 20° to 200° C higher than the theoretical melting temperature of the solder. In an exemplary embodiment, the bond temperature is advantageously about 400° C. At this temperature, the solder tip 38 advantageously provides reliable solder joints without damaging the neighboring area. Indeed, higher temperature will result in faster reflow and better solder wetting, however, high temperatures are also more likely to damage the PCB and reduce the life of the solder tip 38.

Advantageously, the rate or speed at which the solder tip 38 increases from idle to bond temperatures, referred to as the rate setting, is determined experimentally. This rate setting has several effects on system performance. If the rate is too slow, a safety timer incorporated within the system 20 may expire before bond temperature is achieved, aborting the cycle. The safety timer shuts down the heating process within two seconds if the rate setting is too low to obtain bond temperature. If the rate is too fast, the actual temperature will cancel the bond temperature by an undesirable amount. High heat rate settings may be used in the soldering process to burn through the wire insulation, especially dual wires. High heat rates however, also reduce the service life of the solder tip assembly 32.

The time period during which the solder tip 38 maintains a bond temperature is referred to as the bond cycle time. It is measured in cycles of AC current, preferably at 60 Hz. A bond cycle time of 120 would therefore be 2 seconds. The bond cycle time must be selected to ensure proper formation of the solder joint without overheating the solder tip 38 which is likely to have adverse affects on the performance of the system. The bond cycle is advantageously selected to be 110. An audio signal is triggered when the solder tip reaches a cool temperature. The cool temperature is selected to ensure that the solder joint is solidified prior to the audio signal and retracting of the solder tip 38. The cool temperature is advantageously selected to be 100° C.

FIGS. 2, 3 and 4, show the solder tip assembly 32 with the solder tip 38 mounted thereto. The solder tip 38 may be custom designed for different applications and constructed to specific requirements. For instance, different types of solder pads have different geometries and volumes. Accordingly, the solder tip 38 may be adapted to different uses. For advantageous results, in a single application, the solder pads should be consistent in geometry and orientation and the height of the solder deposit must be in the 0.004 to 0.010 inch range. In the preferred embodiment, the solder tip 38 is preferably constructed from tungsten carbide. The solder tip assembly 32 comprises a heater bar 40 to which the solder tip 38 is preferably welded or attached by any other suitable means. The heater bar 40 is composed of gold plated bar stock 42 with a longitudinal shim 44 (as shown in FIGS. 2 and 3) in the center. The solder tip 38 is mounted at a base 45 of the heater bar 40 by a platinum wire 46. Attached to the platinum wire 46 is a thermocouple 48 (shown in FIG. 2) which is used to monitor the temperature of the solder tip 38. The voltage produced by the thermocouple 48 is connected to a process controller by thermocouple assembly wires 52. The wires 52 are connected to a strain relief 54 (shown in FIGS. 2 and 4) on the bar stock 42 to prevent any strain on the wires 52 from being applied at the fragile point where the bare wires are attached to the thermocouple 48. As shown in FIGS. 2 and 3, an opening 56 extending horizontally through the heater bar 40 is provided for suitably mounting on the solder head 24.

Figure 11:
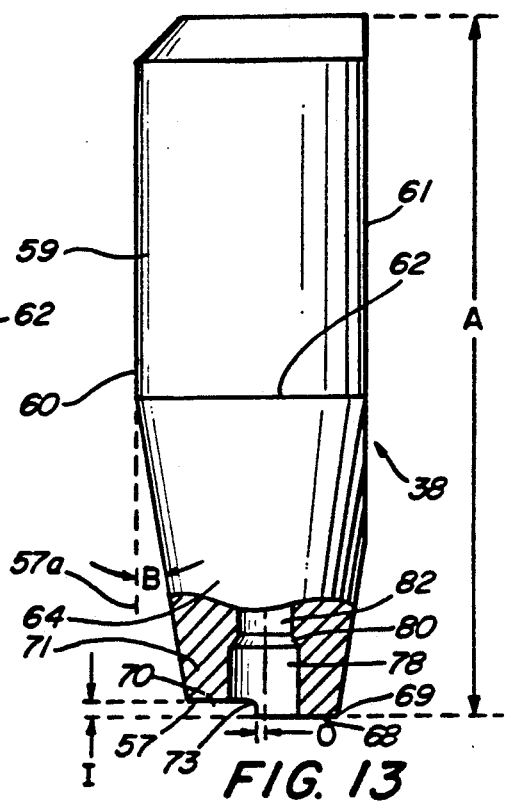
FIG. 11 is a side elevational view partially in section of the solder tip of the present invention.
Figure 12:
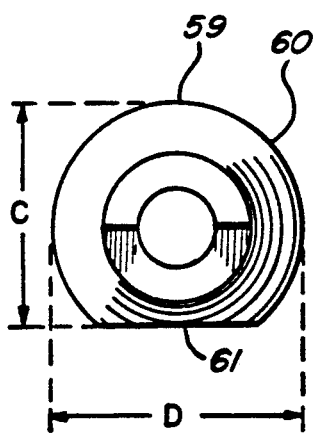
FIG. 12 is a bottom view of the solder tip of the present invention.

Referring to FIGS. 5, 10, 11 and 12 the external configuration of a preferred embodiment of the solder tip 38 of the present invention is shown in greater detail. The solder tip 38 has a body portion 60 which is generally semi-cylindrical in shape. The body portion 60 has an external periphery defined by a semi-cylindrical wall 59 and a straight wall 61. The body portion 60, at one end 62, terminates in a conical portion 64. As shown clearly in FIG. 5, at the end 62, the wall 61 terminates in a parabolic portion 65 which protrudes into a section of the conical portion 64. In an exemplary embodiment, the length A of the entire solder tip 38, shown in FIG. 11, is preferably 0.17 inches. The conical portion 64 gradually tapers to a base extremity 57 of the solder tip 38, preferably at an angle B of 15° from the longitudinal axis shown offset at 57a in FIG. 11. In an exemplary embodiment, the semi-cylindrical wall 59 of the body portion 60 advantageously has a diameter D of 0.062 inches, shown in FIG. 12. Likewise, the thickness C between the semi-cylindrical wall 59 and the straight wall 61 is preferably 0.050 inches, shown in FIG. 12.

The base extremity 57 which contacts the wire 90 is structured with an igloo shaped end. As shown clearly in FIGS. 5, 6, 11 and 13, the end surface 66 has a stepped shape having a surface 71 which forms an opening 70 for accepting the wire 90 and a projecting leg 68. In an exemplary embodiment, the base extremity 57 advantageously has an outer diameter E of 0.022 inches, shown in FIG. 10. The opening 70 and the projecting leg 68 are joined by an angled wall 72. In an exemplary embodiment, the angled wall 72 is located on a lateral axis parallel to a longitudinal axis extending through the center of the solder tip body 60, from which it is offset by a predetermined amount 0 shown in FIG. 11, preferably by about 0.001 inches. The angled wall 72, at 73, has a radius of curvature of about 0.002 inches. The "igloo" opening 70 has a height I, shown in FIG. 13, of preferably 0.002 inches. By utilizing a stepped surface 66, the opening 70 positions one end of the wire while the projecting leg 68 contacts the other end of the wire and immerses it into the molten solder. Such a configuration provides a single opening which accepts the wire allowing it to be properly positioned across the center of the solder pad 88. Such a configuration also provides a wire relief step which advantageously prevents damage to the wire from the magnetic head. The solder tip 38 has an opening 74. The opening 74 communicates with a center shaft or vent 76 which extends longitudinally through the solder tip 38. The thickness of the solder tip wall surrounding the opening 74 is advantageously 0.006 inches.

FIGS. 6, 7, 8, 9, 10 and 13 illustrate the igloo-like configuration of the solder tip 38. The center shaft or vent 76 of the solder tip 38 comprises a cylindrical section 78 at the base extremity 57 of the solder tip 38. In an exemplary embodiment, as shown in FIG. 10, the cylindrical section 78 is preferably has a width F of 0.016 inches and a length G of 0.015 inches. The cylindrical section 78 terminates in a tapered section 80 disposed directly above the cylindrical section 78. In an exemplary embodiment, the tapered section 80 has a radius of curvature shown at 80a of 0.001 inches. The tapered section 80 joins a narrow section 82 directly above the tapered section 80. In an exemplary embodiment, the narrow section 82 preferably has a diameter shown by H of 0.012 inches plus or minus 0.001 inches shown in FIG. 10. This arrangement advantageously allows for the escape of smoke and other gasses from burning insulation so that they do not interfere with the operator's view of the soldering operation. It is also desirable to allow expanding gases to escape in order to prevent solder from being squeezed out by the pressure build up.

Figure 13:
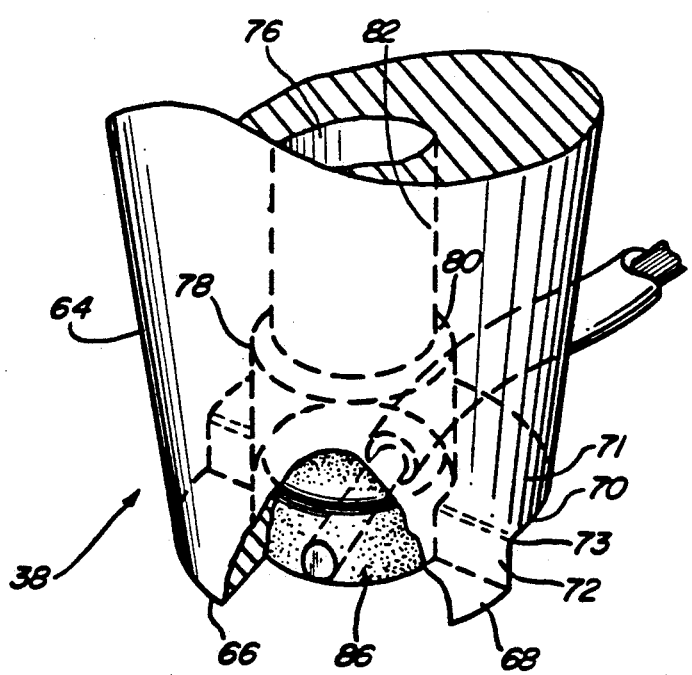
FIG. 13 is a perspective view partially in section of the solder tip of the present invention.
Figure 14:
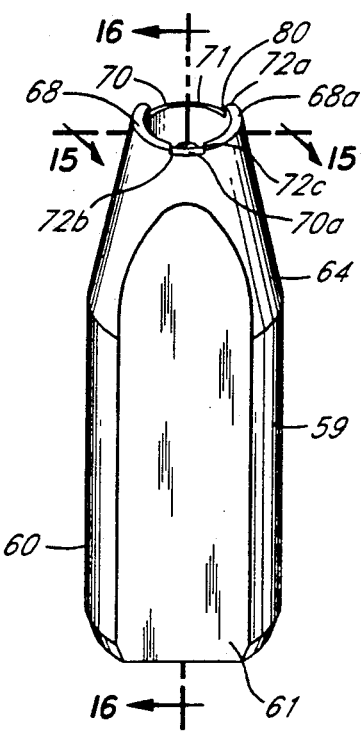
FIG. 14 is a perspective view of an alternative embodiment of the solder tip of the present invention.
Figure 17:
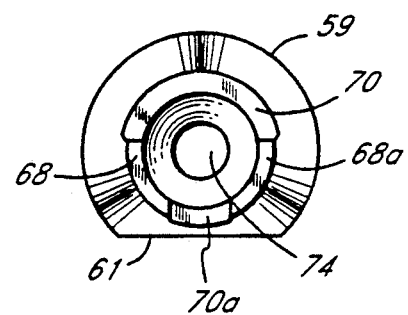
FIG. 17 is a bottom view of an alternative embodiment of the solder tip of the present invention.

As shown clearly in FIG. 13, the cylindrical section 78 serves as a counter bore which allows space for excess solder and which enables the solder tip 38 to accommodate a wide variation in the amount of solder which is applied to the pads.

FIGS. 6, 7, 8 and 9 illustrate the operation of the solder tip 38 of the present invention in a reflow solder environment. Referring specifically to FIG. 6, a solder deposit 86 is present on the solder pad 88. The magnetic head wire 90 to be soldered to the solder pad 88 is positioned above the solder pad 88 prior to attachment of the wire. The wire 90 need not be stripped of insulation 92. Further, the stripping operation can damage the magnetic head (not shown) to which the wire 90 is attached.

As shown in FIG. 7, the solder tip 38 is next actuated downward so that the solder tip 38 presses the wire 90 against the solder deposit 86 on the solder pad 88. Advantageously, the solder tip 38 comes to rest on the wire 90 and does not damage the KAPTON ® layer 93 of the printed circuit board which is in the immediate vicinity. At this point, the power supply 22 heats the solder tip 38.

As shown in FIG. 8, the solder tip 38 is actuated further downward such that the wire 90 is pressed against the solder pad 88 as the solder deposit 86 gradually melts with the transfer of heat from the solder tip 38. As shown clearly in FIG. 13, the solder is squeezed by this operation into the cylindrical section 78 of the solder tip 38. The insulation 92 of the wire 90 is burned by the heat of the soldering operation. The burnt insulation rises to the top of the solder deposit 86 as shown by the patches 94 leaving the wire 90 completely bare of insulation at 95.

The leg 68 compresses the trailing end of the wire 90 to maintain the wire 90 in contact with the pad area and stay in contact until the solder joint solidifies. In this fashion the risk of wire movement during solidification of the solder is minimized. The opening 70 of the solder tip 38 holds the wire 90 against the solder pad without pinching or denting it while the leg 68 provides a slight dent in the wire 90 without damaging it.

Referring to FIG. 9, once the solder joint has been formed, the solder tip 38 is raised. The trailing end of the wire 90 is removed by fatiguing the wire such as manually rotating it several times Alternatively, the projecting leg 68 may be provided with a sharp surface to sever the trailing edge of the wire 90.

Figure 15:
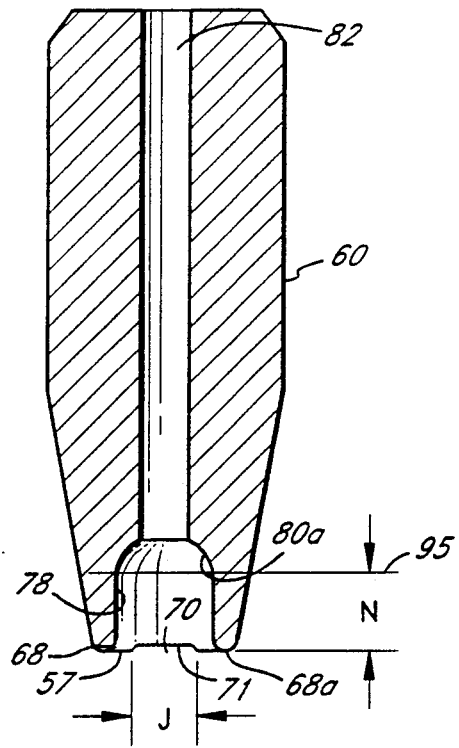
FIG. 15 is a cross sectional view taken along line 15—15 of FIG. 14.
Figure 16:
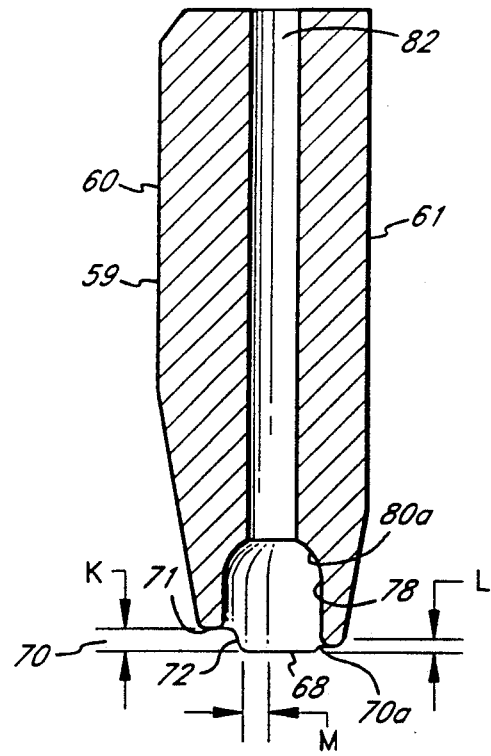
FIG. 16 is a cross sectional view taken along line 16—16 of FIG. 14.

Referring now to FIGS. 14, 15, 16 and 17, in accordance with an alternative embodiment, the stepped surface 66 is configured such that there is an additional projecting leg 68a adjacent opening 70. The opening 70 and the projecting leg 68a are joined at end 80 by an angled wall 72a. The projecting leg 68 is separated from the projecting leg 68a, by a second opening 70a opposite the opening 70. The second opening 70a is separated from each of the projecting legs 68 and 68a by angled walls 72b and 72c, respectively. Such a configuration advantageously provides two openings, a larger opening through which one or more wires may be accepted and a relatively smaller opening which provides an exit for the trailing wire. In the illustrated embodiment, opening 70 is large enough to easily accept one or more wires therethrough. In an exemplary embodiment, the larger opening 70 preferably has a width J of 0.012 inches, shown in FIG. 15. In an exemplary embodiment, the opening 70 has a height K, shown in FIG. 16, of 0.0030 inches. The opening 70a has a height L, shown in FIG. 16, of preferably 0.0020 inches. In an exemplary embodiment, the angled wall 72 is offset from a central longitudinal axis by an amount M of 0.002 inches. In accordance with the alternative embodiment, the solder tip 38 has a plunger-like configuration, as shown in FIGS. 15 and 16. The cylindrical section 78 in an exemplary embodiment has a length N of 0.015 inches, shown in FIG. 15. An arcuate section 80a in the exemplary embodiment is formed on either side by an arc of 45° and a radius of 0.008 inches from the center of an axis 95 extending from the top of the cylindrical section 78.

It will be appreciated that certain structural variations may suggest themselves to those skilled in the art. The foregoing detailed description is to be clearly understood as given by way of illustration, the spirit and scope of this invention being defined solely by the appended claims.

I claim:

1. A device for use with a reflow power supply for soldering a conductive lead to a solder pad, comprising:
   a soldering tip;
   a passage extending through said soldering tip, said passage allowing expanding gases to escape to prevent pressure build up resulting in solder squeeze-out;
   a stepped surface at a base extremity of said soldering tip, said stepped surface having at least one opening and at least one projecting leg; and
   a counter bore room at said base extremity of said soldering tip, said counter bore room providing space for excess solder, said counter bore room allowing said soldering tip to accommodate a wide variation in the amount of solder applied to said solder pad, said counter bore room being in direct connection with said passage.

2. A device for use with a reflow power supply for soldering a conductive lead to a solder pad as defined in claim 1, wherein a portion of said stepped surface which forms said at least one opening positions a conductive lead and said projecting leg contacts said conductive lead and immerses said conductive lead in molten solder, wherein said at least one opening and said projecting leg are on opposing sides of said base extremity of said soldering tip.

3. A device for use with a reflow power supply for soldering a conductive lead to a solder pad, as defined in claim 1, wherein said counter bore room comprises a cylindrical section having a first diameter length.

4. A device for use with a reflow power supply for soldering a conductive lead to a solder pad, comprising:
   a soldering tip;
   a passage extending through said soldering tip, said passage allowing expanding gases to escape to prevent pressure build up resulting in solder squeeze-out;
   a stepped surface at a base extremity of said soldering tip, said stepped surface having two projecting legs forming two openings therebetween, a first opening for accepting a conductive lead and a second opening for allowing said conductive lead to exit; and
   a counter bore room at said base extremity of said soldering tip, said counter bore room providing space for excess solder, said counter bore room allowing said soldering tip to accommodate a wide variation in the amount of solder applied to said solder pad.

5. A device for use with a reflow power supply for soldering a conductive lead to a solder pad, comprising:
   a soldering tip;
   a passage extending through said soldering tip, said passage allowing expanding gases to escape to prevent pressure build up resulting in solder squeeze-out;
   a stepped surface at a base extremity of said soldering tip, said stepped surface having at least one opening and at least one projecting leg; and
   a counter bore room at said base extremity of said soldering tip, said counter bore room providing space for excess solder, said counter bore room allowing said soldering tip to accommodate a wide variation in the amount of solder applied to said solder pad, wherein said counter bore room comprises a cylindrical section having a first diameter length and wherein said shaft has a second diameter less than said first diameter length of said cylindrical section.

6. A soldering tip for use with a reflow power supply for forming a reliable solder joint when soldering a conductive lead to a solder pad, comprising:
   a body portion having a semi-cylindrical surface adjoining a flat surface, said semi-cylindrical surface gradually tapering and terminating at one end in an opening, said body portion further comprising:
   a passage extending through said body portion, said passage allowing expanding gases to escape to prevent pressure build up resulting in solder squeeze-out;
   a stepped surface at a base extremity of said soldering tip, said stepped surface having at least one opening and at least one projecting leg, a portion of said stepped surface which forms said opening positioning a conductive lead and said projecting leg contacting said conductive lead and immersing it into molten solder on the solder pad; and
   a counter bore room at said base extremity of said soldering tip, said counter bore room providing space for excess solder, said counter bore room allowing said soldering tip to accommodate a wide variation in the amount of solder applied to said solder pad, said counter bore room being in direct connection with said passage.

7. A method for forming a reliable solder joint when soldering a fine conductive lead to a solder pad having a solder deposit, comprising the steps of:
   providing a solder tip having a shaft, a base extremity configured with a stepped surface having at least one opening and at least one projecting leg and a counter bore room for excess solder;
   contacting one end of the fine conductive lead with a surface forming said opening and immersing an other end of said wire into molten solder on the solder pad with said projecting leg;
   burning the insulation on the conductive lead by heating said solder tip to a predetermined temperature;
   accommodating a wide variation in the amount of solder applied by receiving excess solder in said counter bore room; and
   allowing expanding gases to escape through said vent and preventing solder from being squeezed out by build up of pressure.

8. A method for forming a reliable solder joint, as defined in claim 7, further comprising the step of:
   allowing the solder joint to solidify at a low temperature prior to retracting said solder tip.

* * * * *